United States Patent
Wang

(10) Patent No.: US 8,736,474 B1
(45) Date of Patent: May 27, 2014

(54) DELTA-SIGMA MODULATOR FOR CONVERTING AN ANALOG INPUT SIGNAL TO A DIGITAL OUTPUT SIGNAL USING DELTA-SIGMA MODULATION

(71) Applicant: Richtek Technology Corp., Chupei (TW)

(72) Inventor: Chih-Hsien Wang, Pingzhen (TW)

(73) Assignee: Richtek Technology Corp., Chupei, Hsinchu (TW)

( * ) Notice: Subject to any disclaimer, the term of this patent is extended or adjusted under 35 U.S.C. 154(b) by 0 days.

(21) Appl. No.: 13/846,627

(22) Filed: Mar. 18, 2013

(30) Foreign Application Priority Data

Jan. 7, 2013 (TW) .............................. 102 1 100427 A

(51) Int. Cl.
*H03M 3/00* (2006.01)
(52) U.S. Cl.
USPC ............ 341/143; 708/271; 341/155; 341/144
(58) Field of Classification Search
USPC ................................... 341/143–155; 708/271
See application file for complete search history.

(56) References Cited

U.S. PATENT DOCUMENTS

| 5,598,158 | A  | * | 1/1997 | Linz .............................. | 341/143 |
| 6,738,003 | B2 | * | 5/2004 | Melanson ..................... | 341/143 |
| 6,738,004 | B2 | * | 5/2004 | Melanson ..................... | 341/143 |
| 6,842,129 | B1 | * | 1/2005 | Robinson ...................... | 341/143 |
| 7,577,695 | B2 | * | 8/2009 | Dai ............................... | 708/271 |

* cited by examiner

*Primary Examiner* — Lam T Mai
(74) *Attorney, Agent, or Firm* — Blakely Sokoloff Taylor & Zafman

(57) ABSTRACT

A delta-sigma modulator includes: a loop filter for processing an analog input signal and a feedback signal to generate a filtered signal; a noise coupler operable to generate a noise coupled signal based on the filtered signal and the feedback signal; a quantizer for quantizing the noise coupled signal to generate a digital output signal; and a digital-to-analog converter converting the digital output signal to the feedback signal. The noise coupler includes an amplifier that has an inverting input terminal receiving a difference between the filtered signal and the feedback signal, and a non-inverting output terminal outputting the noise coupled signal, and a capacitor coupled between the inverting input terminal and the non-inverting output terminal of the amplifier.

5 Claims, 5 Drawing Sheets

DELTA-SIGMA MODULATOR FOR CONVERTING AN ANALOG INPUT SIGNAL TO A DIGITAL OUTPUT SIGNAL USING DELTA-SIGMA MODULATION

CROSS-REFERENCE TO RELATED APPLICATION

This application claims priority of Taiwanese Application No. 102100427, filed on Jan. 7, 2013, the contents of which are hereby incorporated by reference.

BACKGROUND OF THE INVENTION

1. Field of the Invention

This invention relates to a modulator, and more particularly a delta-sigma modulator.

2. Description of the Related Art

FIG. 1 illustrates a conventional delta-sigma modular proposed by K. Lee, M. R. Miller, G. C. Temes, in "An 8.1 mW, 82 dB Delta-Sigma ADC with 1.6 MHz BW and −98 dB THD," Proc. IEEE Custom Integrated Circuits Conf. (CICC), pp. 93-96, September 2008. The conventional delta-sigma modulator converts an analog input signal ($U(z)$) to a digital output signal ($V(z)$) using delta-sigma modulation. The conventional delta-sigma modulator includes a loop filter 11, a noise coupler 12, a quantizer 13 and a digital-to-analog converter 14. The loop filter 11 is a second-order filter.

A relationship between the analog input signal ($U(z)$) and the digital output signal ($V(z)$) can be expressed as the following equation:

$$V(z)=STF(z) \cdot U(z)+NTF(z) \cdot (1-z^{-1}) \cdot Q(z),$$

where $STF(z)$ is a signal transfer function attributed to the loop filter 11, $NTF(z)$ is a noise transfer function attributed to the loop filter 11, $1-z^{-1}$ is a noise coupling function attributed to the noise coupler 12, and $Q(z)$ is a quantization noise introduced by the quantizer 13. It can be appreciated from the aforesaid equation that the noise coupler 12 can increase the order of noise shaping of the conventional delta-sigma modulator by one. In other words, the conventional delta-sigma modulator can achieve third-order noise shaping.

Referring further to FIG. 2, the conventional delta-sigma modulator is implemented using switched-capacitor techniques. The analog input signal ($U(z)$) is a single-ended signal. The noise coupler 12 includes an amplifier, three capacitors ($C_{H1}$, $C_{H2}$, $C_{F3}$) and twelve switches, which are operable based on eight control signals ($\phi_{odd}$, $\phi_{even}$, $\phi_{1o}$, $\phi_{1e}$, $\phi_{2o}$, $\phi_{2e}$, $\phi_{1D}$, $\phi_2$). Therefore, due to the configuration of such noise coupler 12, the conventional delta-sigma modulator has a relatively complicated circuit structure, thereby increasing the complexity in circuit control.

SUMMARY OF THE INVENTION

Therefore, the object of the present invention is to provide a delta-sigma modulator that can overcome the aforesaid drawback associated with the prior art.

According to this invention, there is provided a delta-sigma modulator for converting an analog input signal to a digital output signal using delta-sigma modulation. The delta-sigma modular of this invention comprises a loop filter, a noise coupler, a quantizer, and a digital-to-analog converter.

The loop filter processes the analog input signal, and a feedback signal related to the digital output signal, using summation and integration to generate a filtered signal.

The noise coupler is coupled to the loop filter for receiving the filtered signal therefrom. The noise coupler is operable to generate a noise coupled signal based on the filtered signal and the feedback signal. The noise coupled signal is obtained by coupling the filtered signal with a difference between the noise coupled signal itself and the feedback signal.

The quantizer is coupled to the noise coupler for quantizing the noise coupled signal from the noise coupler to generate the digital output signal.

The digital-to-analog converter is coupled to the loop filter, the noise coupler and the quantizer. The digital-to-analog converter is operable to convert the digital output signal from the quantizer to an analog signal that serves as the feedback signal.

The noise coupler includes an amplifier and a capacitor. The amplifier has an inverting input terminal capable of receiving a difference between the filtered signal and the feedback signal, and a non-inverting output terminal for outputting the noise coupled signal. The capacitor is coupled between the inverting input terminal and the non-inverting output terminal of the amplifier.

BRIEF DESCRIPTION OF THE DRAWING

Other features and advantages of the present invention will become apparent in the following detailed description of the preferred embodiment of this invention, with reference to the accompanying drawings, in which.

DETAILED DESCRIPTION OF THE PREFERRED EMBODIMENT

Figure 3:
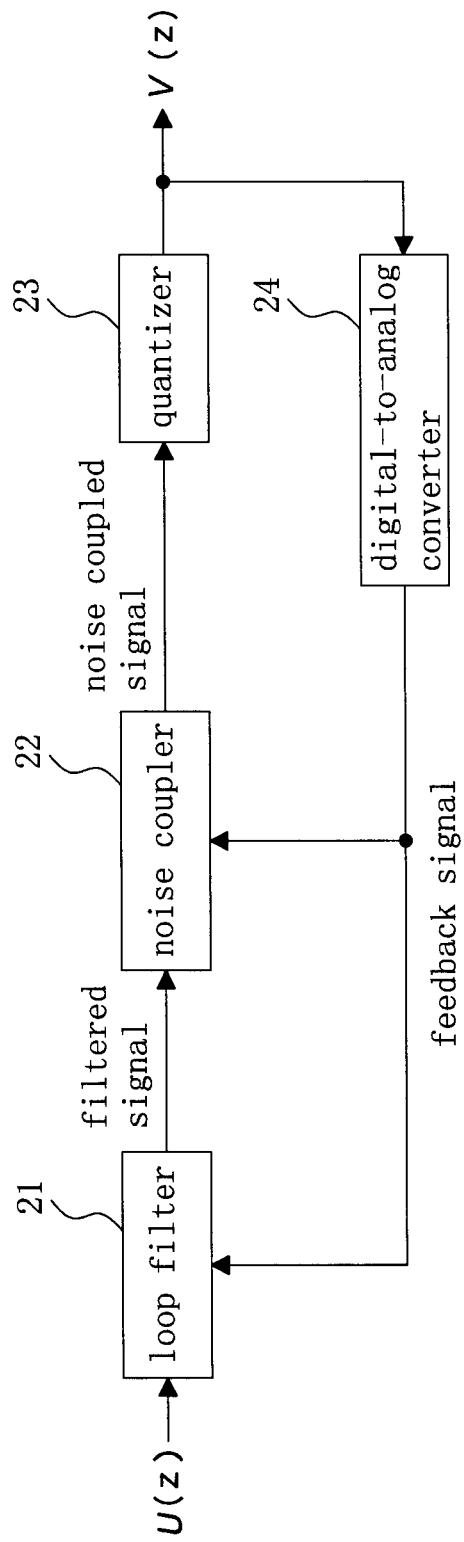
FIG. 3 is a schematic block diagram illustrating the preferred embodiment of a delta-sigma modulator according to this invention.

Referring to FIG. 3, the preferred embodiment of a delta-sigma modulator according to this invention is shown to convert an analog input signal ($U(z)$) to a digital output signal ($V(z)$) using delta-sigma modulation. The delta-sigma modulator includes a loop filter 21, a noise coupler 22, a quantizer 23 and a digital-to-analog (D/A) converter 24.

The loop filter 21 processes the analog input signal ($U(z)$) and a feedback signal that is related to the digital output signal ($V(z)$) using summation and integration to generate a filtered signal. In this embodiment, the loop filter 21 can have the same configuration as that of the loop filter 11 of the conventional delta-sigma modulator in FIG. 1. It is noted that, in practice, the loop filter 21 can be a filter other than a second-order filter, and/or have other functional architecture. Since the feature of this invention does not reside in the configuration of the loop filter 11, which is known to those skilled in the art, details thereof are omitted herein for the sake of brevity.

The noise coupler 22 is coupled to the loop filter 21 for receiving the filtered signal therefrom, and is operable to generate a noise coupled signal based on the filtered signal and the feedback signal. The noise coupled signal is obtained by coupling the filtered signal with a difference between the noise coupled signal itself and the feedback signal.

Figure 1:
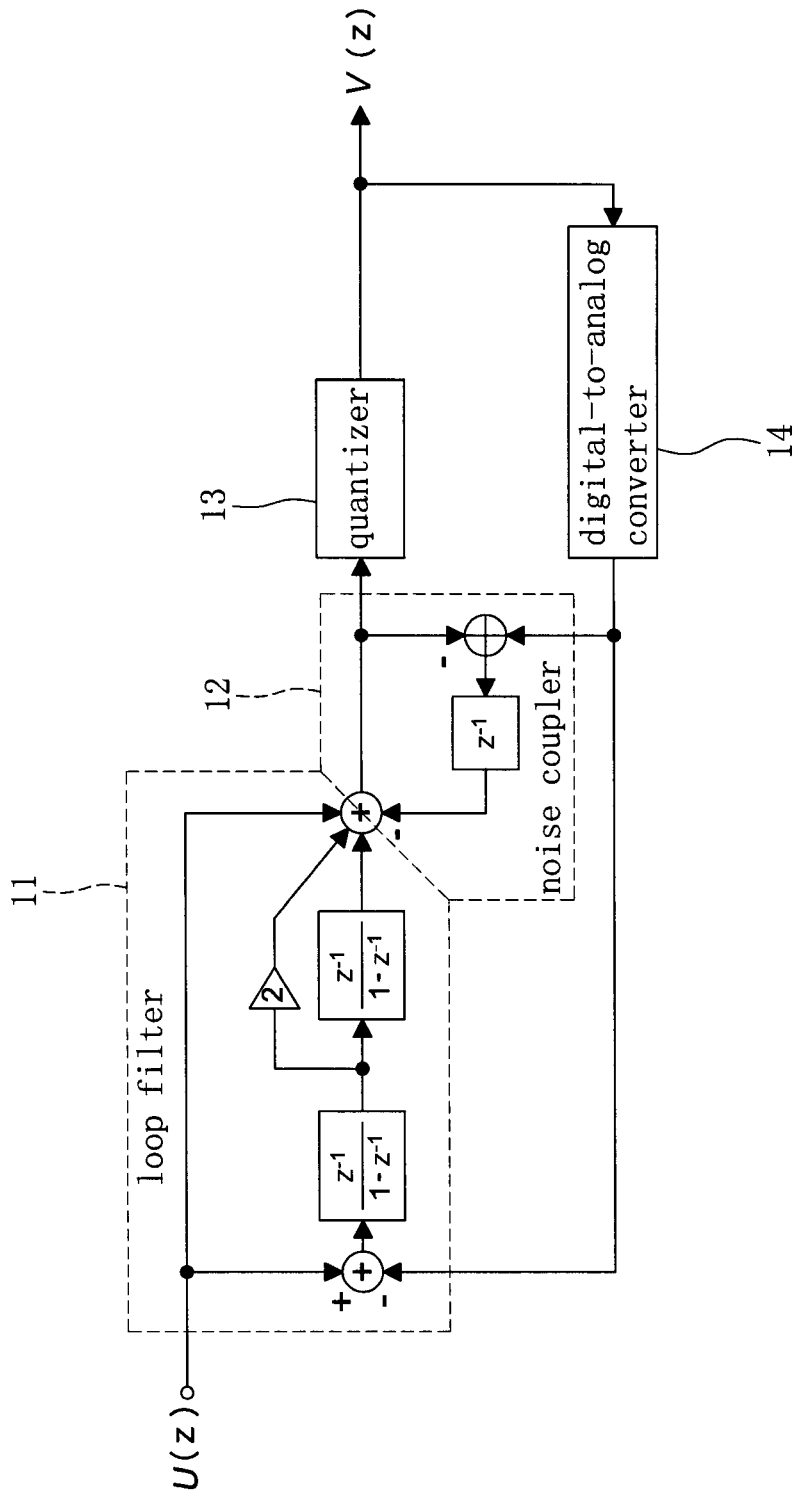
FIG. 1 is a schematic block diagram illustrating a conventional delta-sigma modulator.
Figure 2:
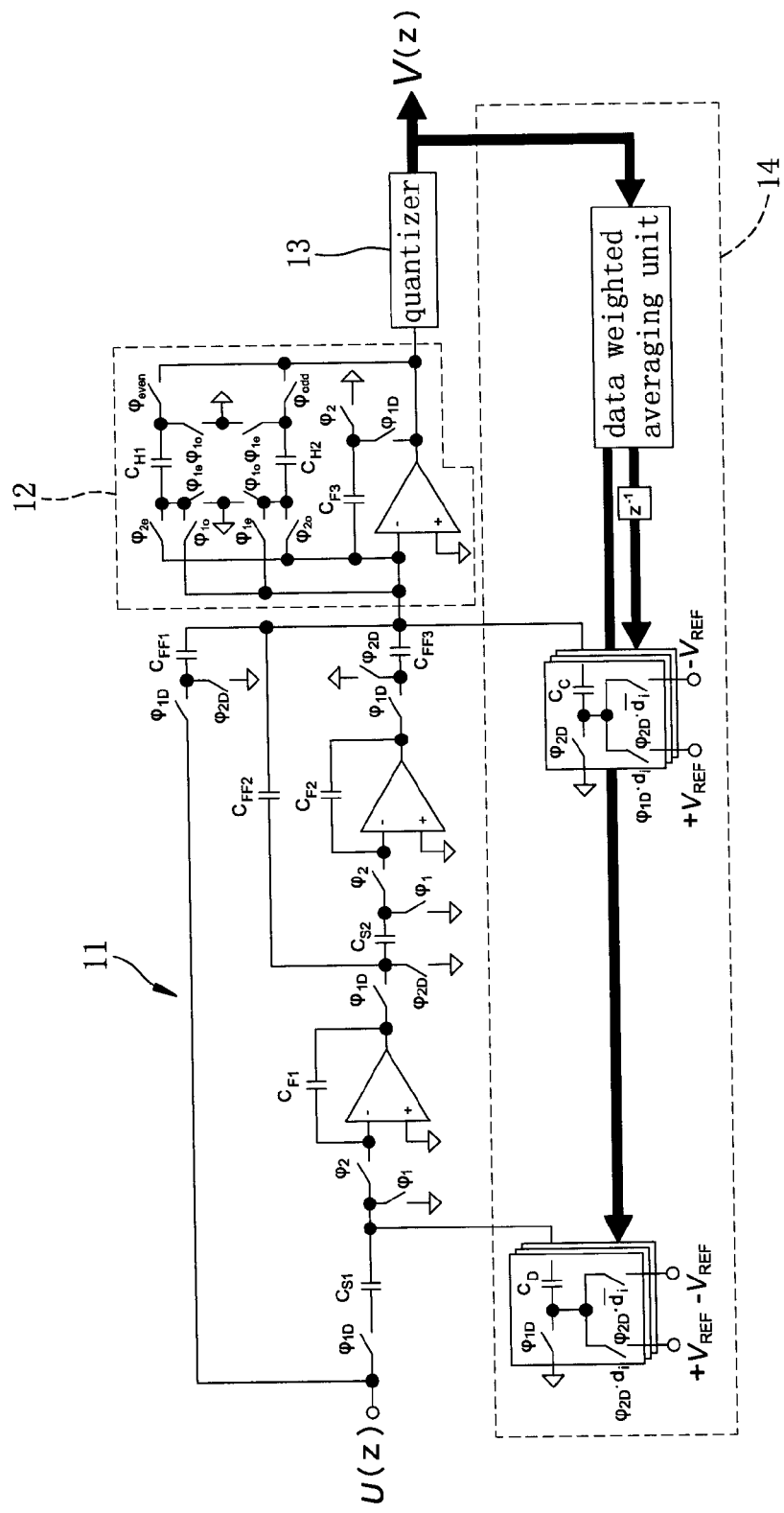
FIG. 2 is a schematic electrical circuit diagram illustrating the conventional delta-sigma modulator.

The quantizer 23, similar to the quantizer 13 of the conventional delta-sigma modulator in FIG. 1, is coupled to the noise coupler 22 for quantizing the noise coupled signal from the noise coupler 22 so as to generate the digital output signal (V(z)).

The D/A converter 24 is coupled to the loop filter 21, the noise coupler 22 and the quantizer 23. The D/A converter 24 is operable to convert the digital output signal (V(z)) to an analog signal that serves as the feedback signal.

Figure 4:
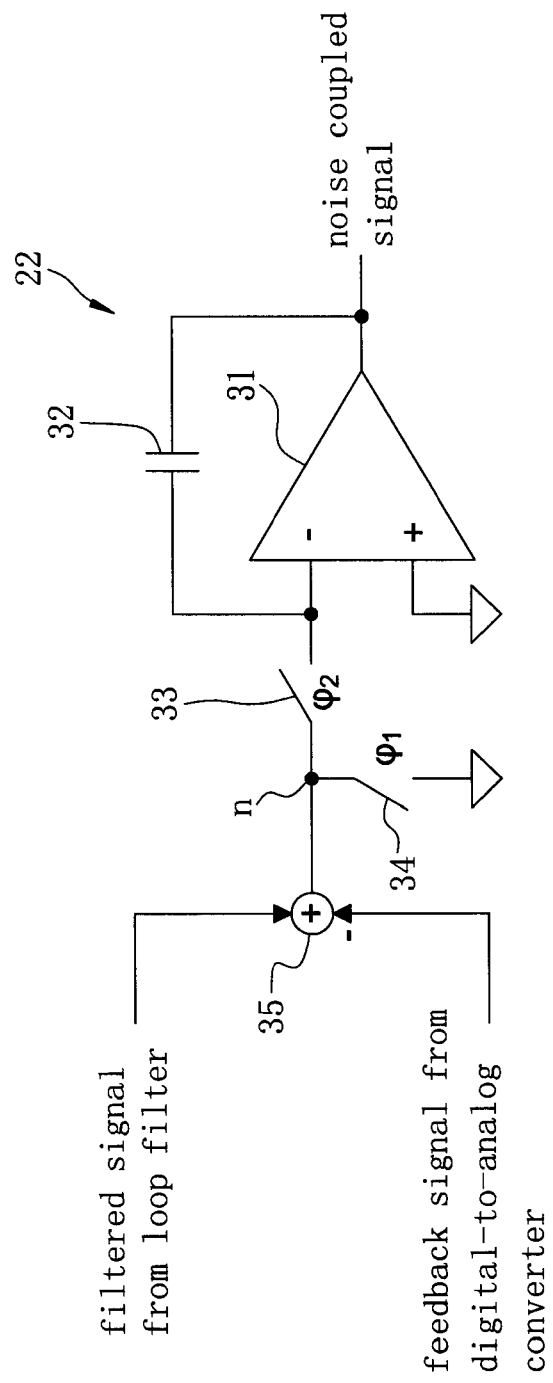
FIG. 4 is a schematic electrical circuit diagram illustrating a noise coupler of the preferred embodiment.

In this embodiment, when the analog input signal (U (z)) is a single-ended signal, referring to FIG. 4, the noise coupler 22 is shown to include an amplifier 31, a capacitor 32, a series connection of a first switch 33 and a second switch 34, and an adder 35. The amplifier 31 has an inverting input terminal, a grounded non-inverting input terminal, and a non-inverting output terminal for outputting the noise coupled signal. The capacitor 32 is coupled between the inverting input terminal and the non-inverting output terminal of the amplifier 31. The first switch 33 is coupled to the inverting input terminal of the amplifier 31, and is operable to conduct or non-conduct in response to a first control signal ($\phi_2$). The second switch 34 includes one terminal that is grounded and another terminal that is coupled to the first switch 33 at a common node (n), and is operable to conduct or non-conduct in response to a second control signal ($\phi_1$). The adder 34 receives the filtered signal and the feedback signal respectively from the loop filter 21 and the D/A converter 24 and outputs a difference between the filtered signal and the feedback signal. The difference between the filtered signal and the feedback signal is then inputted to the common node (n) between the first and second switches 33, 34.

It is noted that the amplifier 31 and the capacitor 32 cooperatively constitute an integrator. As such, when the first switch 33 non-conducts while the second switch 34 conducts, the noise coupled signal is maintained by the integrator constituted by the amplifier 31 and the capacitor 32. Thereafter, when the first switch 33 conducts while the second switch 34 non-conducts, the difference between the filtered signal and the feedback signal is transmitted from the common node (n) to the inverting input terminal of the amplifier 31 through the first switch 33. Thus, the integrator constituted by the amplifier 31 and the capacitor 32 adds the difference between the filtered signal and the feedback signal to the noise coupled signal previously held thereby so as to change the noise coupled signal outputted at the non-inverting output terminal of the amplifier 31. In other words, the noise coupled signal is obtained by coupling the filtered signal with the difference between the noise coupled signal itself and the feedback signal, i.e., a quantization noise introduced by the quantizer 23.

Figure 5:
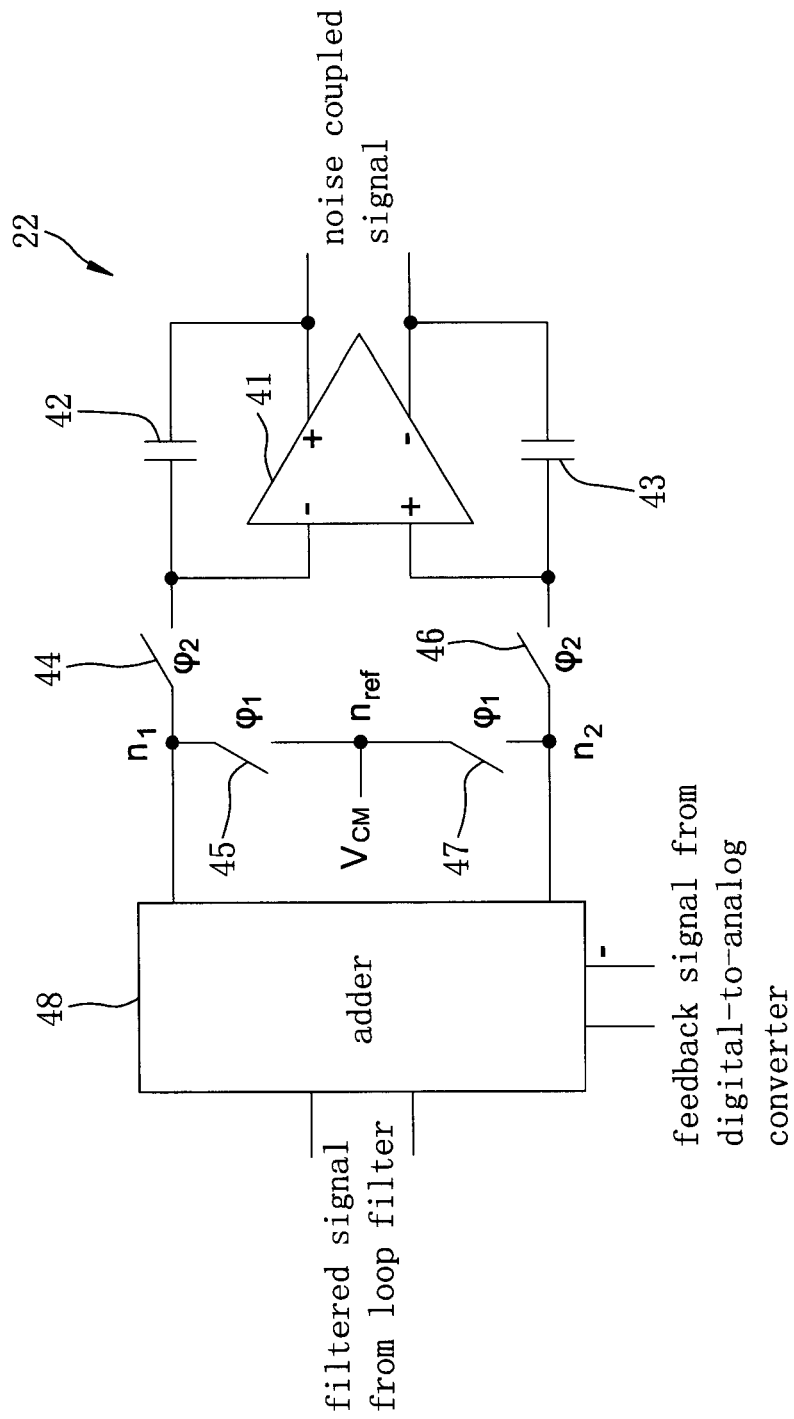
FIG. 5 is a schematic circuit diagram illustrating a variation of the noise coupler of the preferred embodiment.

Alternatively, when the analog input signal (U(z)) is a differential signal, referring to FIG. 5, the noise coupler 22 is shown to include an amplifier 41, a first capacitor 42, a second capacitor 43, a series connection of a first switch 44 and a second switch 45, a series connection of a third switch 46 and a fourth switch 47, a reference node ($n_{ref}$) for receiving a common mode voltage ($V_{CM}$), and an adder 48. The amplifier 41 has an inverting input terminal, a non-inverting input terminal, an inverting output terminal and a non-inverting output terminal. In this case, the inverting output terminal cooperates with the non-inverting output terminal to output the noise coupled signal. The first capacitor 42 is coupled between the inverting input terminal and the non-inverting output terminal of the amplifier 41. The second capacitor 43 is coupled between the non-inverting input terminal and the inverting output terminal of the amplifier 41. The first switch 44 is coupled to the inverting input terminal of the amplifier 41.

The second switch 45 includes one terminal coupled to the reference node ($n_{ref}$), and another terminal coupled to the first switch 44 at a first common node ($n_1$). The third switch 46 is coupled to the non-inverting input terminal of the amplifier 41. The fourth switch 47 includes one terminal coupled to the reference node ($n_{ref}$), and another terminal coupled to the third switch 46 at a second common node ($n_2$). Each of the first and third switches 44, 46 is operable to conduct or non-conduct in response to a first control signal ($\phi_2$). Each of the second and fourth switches 45, 47 is operable to conductor non-conduct in response to a second control signal ($\phi_1$). Similar to the adder 35 in FIG. 4, the adder 48 receives the filtered signal and the feedback signal from the loop filter 21 and the D/A converter 24 and outputs a difference between the filtered signal and the feedback signal. Then, the first common node ($n_1$) between the first and second switches 44, 45 cooperates with the second common node ($n_2$) between the third and fourth switches 46, 47 to receive the difference between the filtered signal and the feedback signal from the adder 48.

It is noted that the amplifier 41, the first capacitor 42 and the second capacitor 43 cooperatively constitute an integrator. As such, when the first and third switches 44, 46 non-conduct while the second and fourth switches 45, 47 conduct, the noise coupled signal is maintained by the integrator constituted by the amplifier 41, and the first and second capacitors 42, 43. Thereafter, when the first and third switches 44, 46 conduct while the second and fourth switches 45, 47 non-conduct, the difference between the filtered signal and the feedback signal is transmitted across the inverting input terminal and the non-inverting input terminal of the amplifier 41 through the first and third switches 44, 46, i.e., the inverting input terminal of the amplifier 41 cooperates with the non-inverting input terminal of the same to receive the difference between the filtered signal and the feedback signal. Thus, the integrator constituted by the amplifier 41, and the first and second capacitors 42, 43 adds the difference between the filtered signal and the feedback signal to the noise coupled signal so as to change the noise coupled signal outputted at the inverting and non-inverting output terminals of the amplifier 41. In other words, the noise coupled signal is obtained by coupling the filtered signal with the difference between the noise coupled signal itself and the feedback signal, i.e., a quantization noise introduced by the quantizer 23.

To sum up, since the noise coupler 22 requires up to four switches 42, 43, 44, 45 and two control signals ($\phi_1$, $\phi_2$), the delta-sigma modulator of this invention has a relatively simpler circuit structure as compared to the aforesaid conventional delta-sigma modulator, thereby reducing the complexity in circuit control.

While the present invention has been described in connection with what is considered the most practical and preferred embodiment, it is understood that this invention is not limited to the disclosed embodiment but is intended to cover various arrangements included within the spirit and scope of the broadest interpretation and equivalent arrangements.

What is claimed is:

1. A delta-sigma modulator for converting an analog input signal to a digital output signal using delta-sigma modulation, said delta-sigma modulator comprising:
   a loop filter for processing the analog input signal, and a feedback signal related to the digital output signal, using summation and integration to generate a filtered signal;
   a noise coupler coupled to said loop filter for receiving the filtered signal therefrom, said noise coupler being operable to generate a noise coupled signal based on the filtered signal and the feedback signal, the noise coupled signal being obtained by coupling the filtered signal with a difference between the noise coupled signal itself and the feedback signal;

a quantizer coupled to said noise coupler for quantizing the noise coupled signal from said noise coupler to generate the digital output signal; and a digital-to-analog converter coupled to said loop filter, said noise coupler and said quantizer, said digital-to-analog converter being operable to convert the digital output signal from said quantizer to an analog signal that serves as the feedback signal;

wherein said noise coupler includes an amplifier having an inverting input terminal capable of receiving a difference between the filtered signal and the feedback signal, and a non-inverting output terminal for outputting the noise coupled signal, and a first capacitor coupled between said inverting input terminal and said non-inverting output terminal of said amplifier.

2. The delta-sigma modulator of claim 1, the analog input signal being a single-ended signal, wherein said amplifier of said noise coupler further has a grounded non-inverting input terminal.

3. The delta-sigma modulator of claim 2, wherein said noise coupler further includes:

an adder coupled to said loop filter and said digital-to-analog converter for receiving the filtered signal from said loop filter and the feedback signal from said digital-to-analog converter and for outputting the difference between the filtered signal and the feedback signal; and a series connection of a first switch and a second switch, said first switch being coupled to said inverting input terminal of said amplifier and being operable to conduct or non-conduct in response to a first control signal, said second switch including one terminal that is grounded and another terminal that is coupled to said first switch at a common node and being operable to conduct or non-conduct in response to a second control signal, said common node between said first and second switches being coupled to said adder for receiving the difference between the filtered signal and the feedback signal therefrom;

wherein, when said first switch conducts while said second switch non-conducts, the difference between the filtered signal and the feedback signal is transmitted from said common node to said inverting input terminal of said amplifier through said first switch.

4. The delta-sigma modulator of claim 1, the analog input signal being a differential signal, wherein:

said amplifier of said noise coupler further has a non-inverting input terminal and an inverting output terminal, said inverting input terminal being able to cooperate with said non-inverting input terminal to receive the difference between the filtered signal and the feedback signal, said non-inverting output terminal cooperating with said inverting output terminal to output the noise coupled signal; and said noise coupler further includes a second capacitor coupled between said non-inverting input terminal and said inverting output terminal of said amplifier.

5. The delta-sigma modulator of claim 4, wherein said noise coupler further includes a reference node, a series connection of a first switch and a second switch, said first switch being coupled to said inverting input terminal of said amplifier and being operable to conduct or non-conduct in response to a first control signal, said second switch including one terminal coupled to said reference node and another terminal coupled to said first switch at a first common node and being operable to conduct or non-conduct in response to a second control signal, a series connection of a third switch and a fourth switch, said third switch being coupled to said non-inverting input terminal of said amplifier and being operable to conduct or non-conduct in response to the first control signal, said fourth switch including one terminal coupled to said reference node and another terminal coupled to said third switch at a second common node and being operable to conduct or non-conduct in response to the second control signal, and an adder coupled to said loop filter, said digital-to-analog converter, said first common node between said first and second switches, and said second common node between said third and fourth switches, said adder receiving the filtered signal from said loop filter and the feedback signal from said digital-to-analog converter and outputting the difference between the filtered signal and the feedback signal to said first and second common nodes; and wherein, when said first and third switches conduct while said second and fourth switches non-conduct, the difference between the filtered signal and the feedback signal is transmitted across said inverting input terminal and said non-inverting input terminal of said amplifier.

* * * * *